(12) United States Patent
Lauga (10) Patent No.: US 6,877,119 B2
(45) Date of Patent: Apr. 5, 2005

(54) CIRCUIT SCAN OUTPUT ARRANGEMENT

(75) Inventor: Christophe Lauga, Westbury Park (GB)

(73) Assignee: STMicroelectronics Limited, Bristol (GB)

( * ) Notice: Subject to any disclaimer, the term of this patent is extended or adjusted under 35 U.S.C. 154(b) by 286 days.

(21) Appl. No.: 09/954,637

(22) Filed: Sep. 14, 2001

(65) Prior Publication Data

US 2003/0056164 A1 Mar. 20, 2003

(51) Int. Cl.[7] ............................................. G01R 31/28
(52) U.S. Cl. ......................................................... 714/726
(58) Field of Search .............................. 714/726, 733, 714/729, 738, 727

(56) References Cited

U.S. PATENT DOCUMENTS 5,983,380 A * 11/1999 Motika et al. ............... 714/733
6,557,129 B1 * 4/2003 Rajski et al. ................ 714/729

* cited by examiner

Primary Examiner—Albert DeCady
Assistant Examiner—James C. Kerveros
(74) Attorney, Agent, or Firm—Lisa K. Jorgenson; David V. Carlson; Seed IP Law Group PLLC (57) ABSTRACT

A semiconductor integrated circuit, including a test scan arrangement has a plurality of scan chains arranged in pairs. These scan chains have input terminals for receiving test patterns, and outputs provided to compression logic such as a distributed XOR tree multiple input shift register to provide an output which is a compressed signal derived from the output test patterns. In an alternative configuration, the first scan chain of each pair is connected to the second scan chain of each pair, and the input terminal of the second scan chain becomes the output terminal. Thereby creating a longer scan chain of the first and second scan chains together with one input terminal and one output terminal. The two loads allow for efficient scanning in the first mode, or debugging to determine the position of a fault in the second mode.

16 Claims, 7 Drawing Sheets

CIRCUIT SCAN OUTPUT ARRANGEMENT

BACKGROUND OF THE INVENTION

1. Field of the Invention

The present invention relates to an arrangement for testing full-scan digital circuits more efficiently, in particular using conventional ATPG tools and techniques.

2. Description of the Related Art

The testing of digital circuits using scan chains is well known to those skilled in the art. In brief, a scan chain is a series of linked flip-flops which are arranged through areas of combinatorial logic on an integrated digital circuit. Each flip-flop receives an input from the previous flip-flop in the chain, and from the combinatorial logic through which the chain passes. At an input pin, a test pattern of logic 1's and 0's is input to the scan chain, and passes through the sequence of flip-flops and combinatorial logic to an output pin. The output sequence of logic 1's and 0's is changed from the input sequence by operation of the logic under test. The manner in which the sequence is changed is not important to determining whether the circuit is functioning correctly. The circuit can be determined to pass or fail the test by simply comparing the output sequence with the output sequence of a correctly functioning circuit.

ITC International Test Conference paper 0-7803-6546-1/00 "Using On-Chip Test Pattern Compression for Full Scan S&C Designs" Lang, Pfeiffer & Maguire proposes various improvements to testing using scan chains. A scan chain architecture is proposed which uses a multiple input shift register (MISR) to receive inputs from a plurality of scan chains to provide a single output, thereby reducing the number of output pins required.

It is standard practice A further improvement is to use software for automatic generation of the test sequences of logic 1's and 0's, known as test patterns, and perform analysis. Such tools are known as Automatic Test Pattern Generation (ATPG) tools and are integral to full scan testing increase the speed of chip testing. A known example is Tetramax™ of Synopsys, Inc. Whilst this tool enhances the speed of testing, on large chips the testing task is significant. On recent graphics chips designs there can be 170 scan chains with 2,600 flip-flops each. This results in excessive test vector counts and/or low test coverage a large processing burden.

BRIEF SUMMARY OF THE INVENTION

The invention is defined in the independent claims to which reference is directed. Preferred features are set out in the dependent claims.

In the embodiment of the invention described, a digital circuit test scan output arrangement allows scan chains to be connected either to compression combinatorial logic, such as a MISR or XOR tree, or to the inputs of other scan chains. This allows scan chains to be a given length when testing conventionally with each scan chain output individually analyzed, or half that given length when tested using the combinatorial logic as an output. The coverage is thereby improved by using shorter scan chains, but without losing the ability to analyze the position of defects with respect to individual scan chains.

The embodiment of the invention also provides a new compression arrangement comprising a distributed XOR tree.

BRIEF DESCRIPTION OF THE SEVERAL VIEWS OF THE DRAWINGS

An embodiment of the invention will now be described, by way of example only, with reference to the accompanying figures, in which.

DETAILED DESCRIPTION OF THE INVENTION

Figure 1:
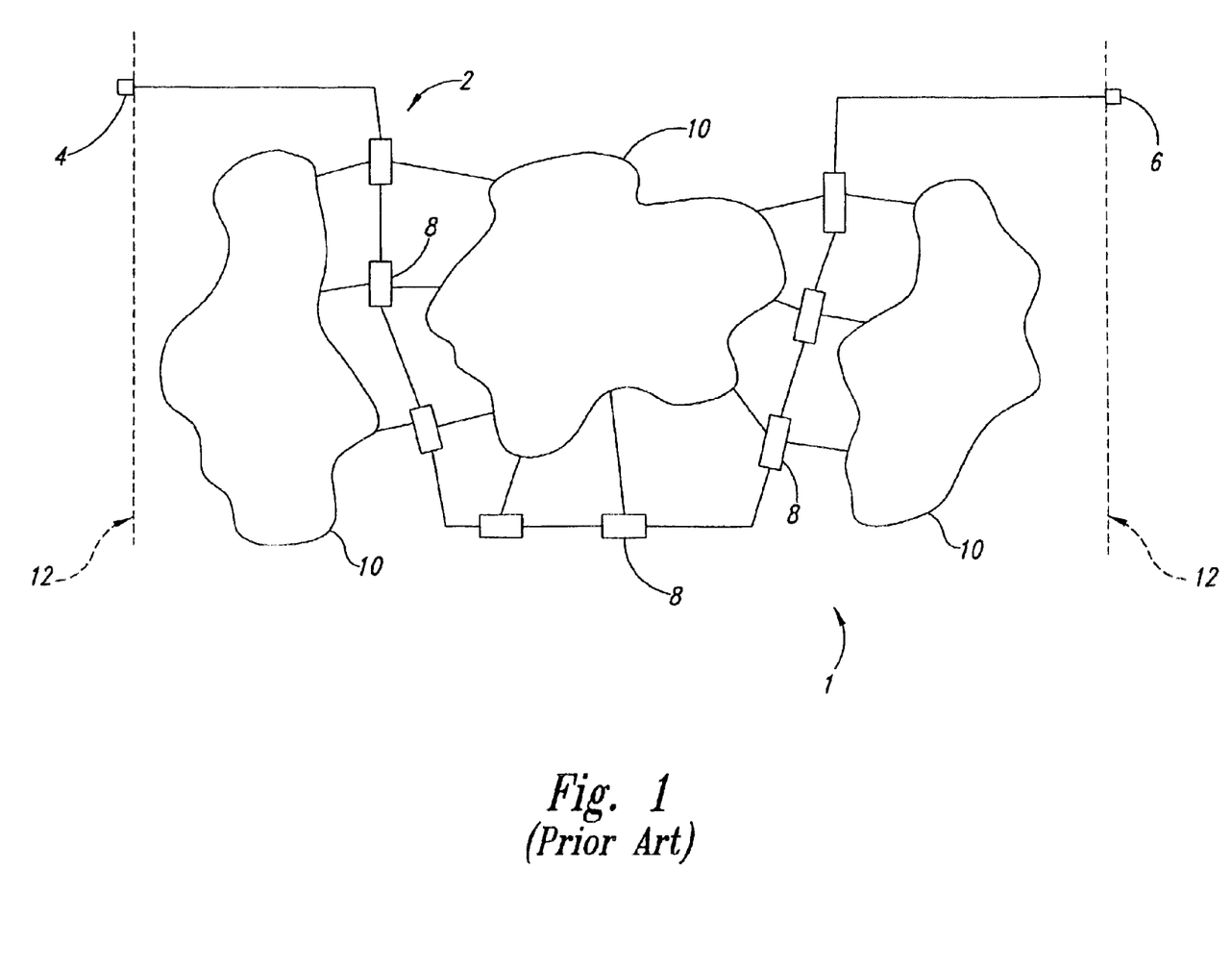
FIG. 1 shows a scan chain within an integrated circuit.

The embodiment described comprises an arrangement of scan chains and outputs for testing a digital integrated circuit, and also a digital integrated circuit including the scan chain arrangement. A schematic view of a scan chain is shown in FIG. 1.

A scan chain 2 comprises a sequence of latches or flip-flops 8 arranged serially between an input pin 4 and an output pin 6. Each flip-flop 8 provides the input to the text in the chain, and also receives signals from the circuitry logic under test. The circuit logic is shown as logic clouds 10 and can be any logic on a chip, such as a graphics controller. In practice, the logic cloud will comprise millions of components as an integrated circuit chip. Similarly, there will be hundreds of scan chains, each comprising thousands of flip-flops, with an input and an output pin for each chain. The chip 1 as a whole is manufactured with the scan chains built in for testing purposes and presents the input pin 4 and output pin 6 at the chip boundary 12.

Figure 2:
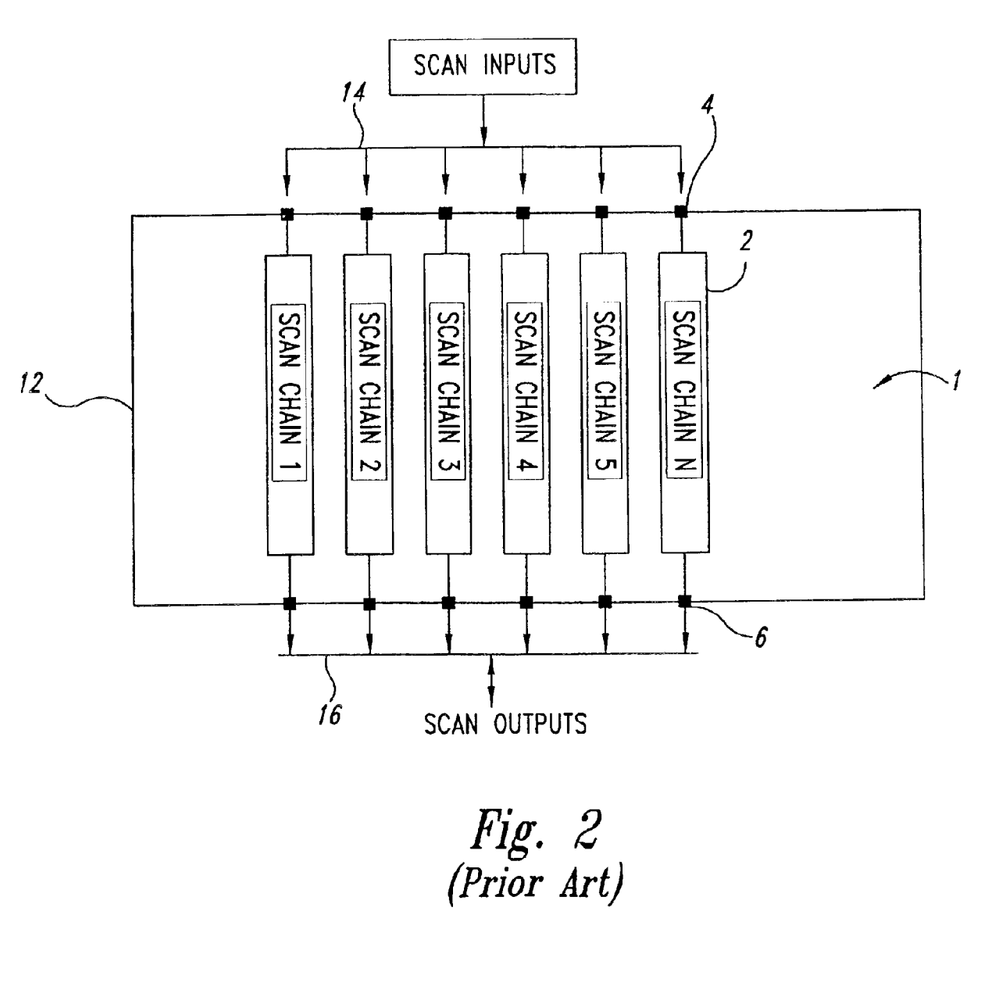
FIG. 2 shows conventional scan chain inputs and outputs.

A conventional scan chain arrangement is shown in FIG. 2. As shown, a series of scan chains 2 are provided which pass through a logic circuit 1 under test (with many discrete logic components, not shown) between input pins 4 and output pins 6 for input signals 14 and output signals 16. The pins are located at the chip boundary 12. [INSERT A from .401 case?] To test the circuit 1 a series of logic bits of 1's and 0's is input at each input pin 4 to one of the respective scan chains 1 to N. The series of bits is known as a test pattern, and is typically provided by an Automatic Test Pattern Generator (ATPG) as previously described. The output from each output pin will be a pattern of 1's and 0's produced as a result of the interaction of the test pattern with the logic of the chip 1. A known correctly functioning chip will produce a given response to a given test pattern at each output pin 6. If there is a defect within the chip, this will be shown up as a difference in one or more of the output sequences. The location of the defect can then be derived, to an extent, from the position of the difference occurring in the test output patterns, and from which scan chains show differences from the expected output. This arrangement is valuable in both determining whether the chip passes the test and, if not, the approximate location of the defect.

The known scan chain arrangement described is well-known and can use existing ATPG tools such as those of Synopsys, Inc. previously mentioned, and is easy to debug in the sense that defects in the chips tested can be located by determining the scan chain (or chains) closest to where the error occurs. However, the arrangement requires two pins per chain, and the scan vectors (the tester steps) can be very long. To improve fault coverage, better use tester memory and improve test times an alternative arrangement is proposed as shown in FIG. 3.

Figure 3:
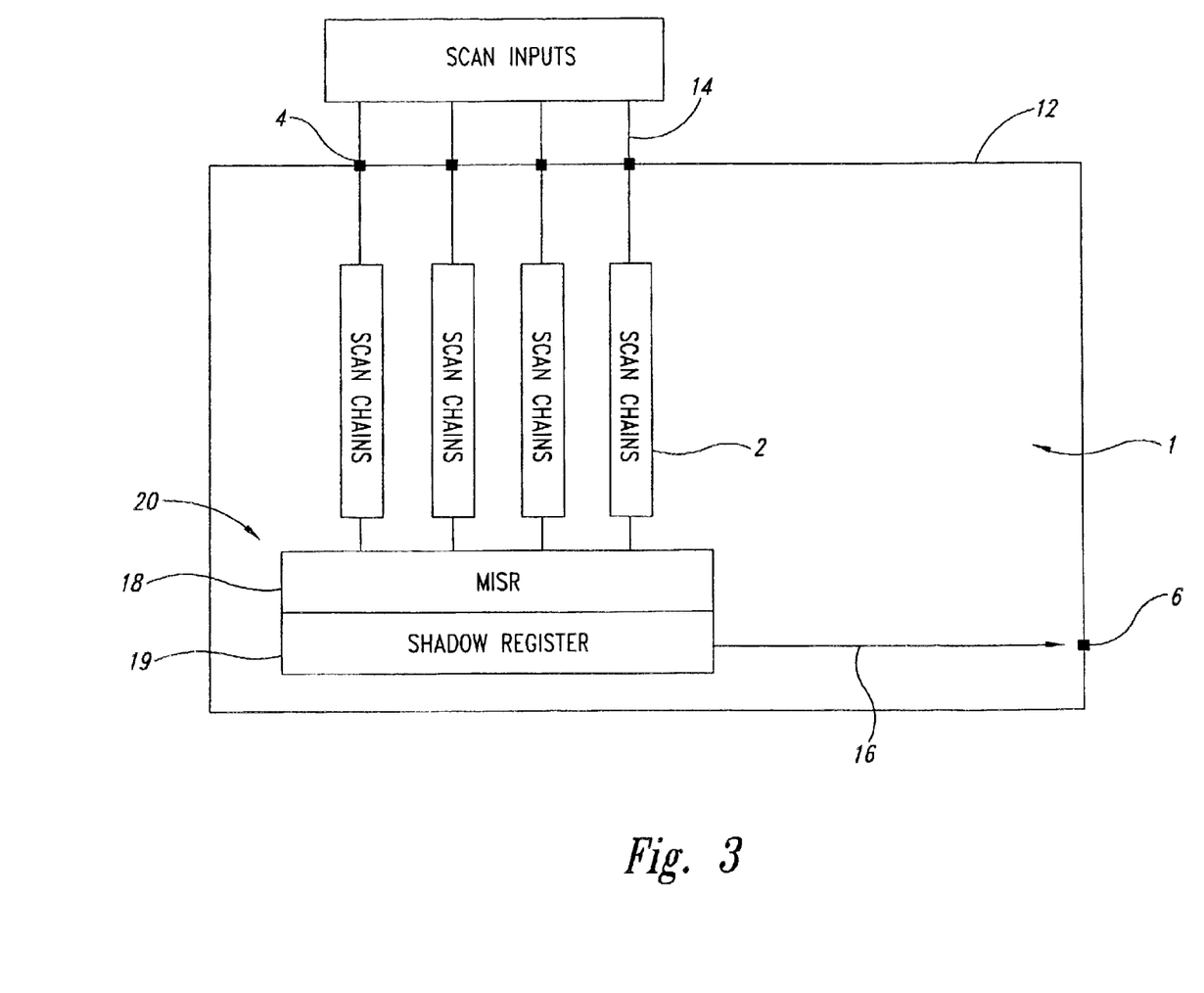
FIG. 3 shows an improved scan chain arrangement using a multiple input shift register (MISR) as an output.

The inventive scan chain arrangement of FIG. 3 comprises scan chains 2 receiving input signals 14 via respective input pins 4 as before. The scan chains are within logic circuitry of a chip 1 defined by a chip boundary 12. The output of each scan chain 2 is provided to compression logic 20, here a multiple input shift register 18 coupled with a shadow register 19. The compression logic could be any logic which takes the bit sequence and applies compression, and includes an XOR tree arrangement described later. With the invention, a single output pin 6 only is required. The compression logic 20 takes the separate inputs from each of the scan chains and produces a single bit output signal. Whilst it would appear that this would reduce the effectiveness of testing, as discussed later, it is unlikely that aliasing (two separate errors producing an apparently correct result) would occur. The scan operation now involves loading the scan chains as normal with test patterns, shifting the outputs into the MISR 18, copying the MISR data to the shadow register 19, resetting the MISR and repeating. This is further shown in FIG. 4.

Figure 4:
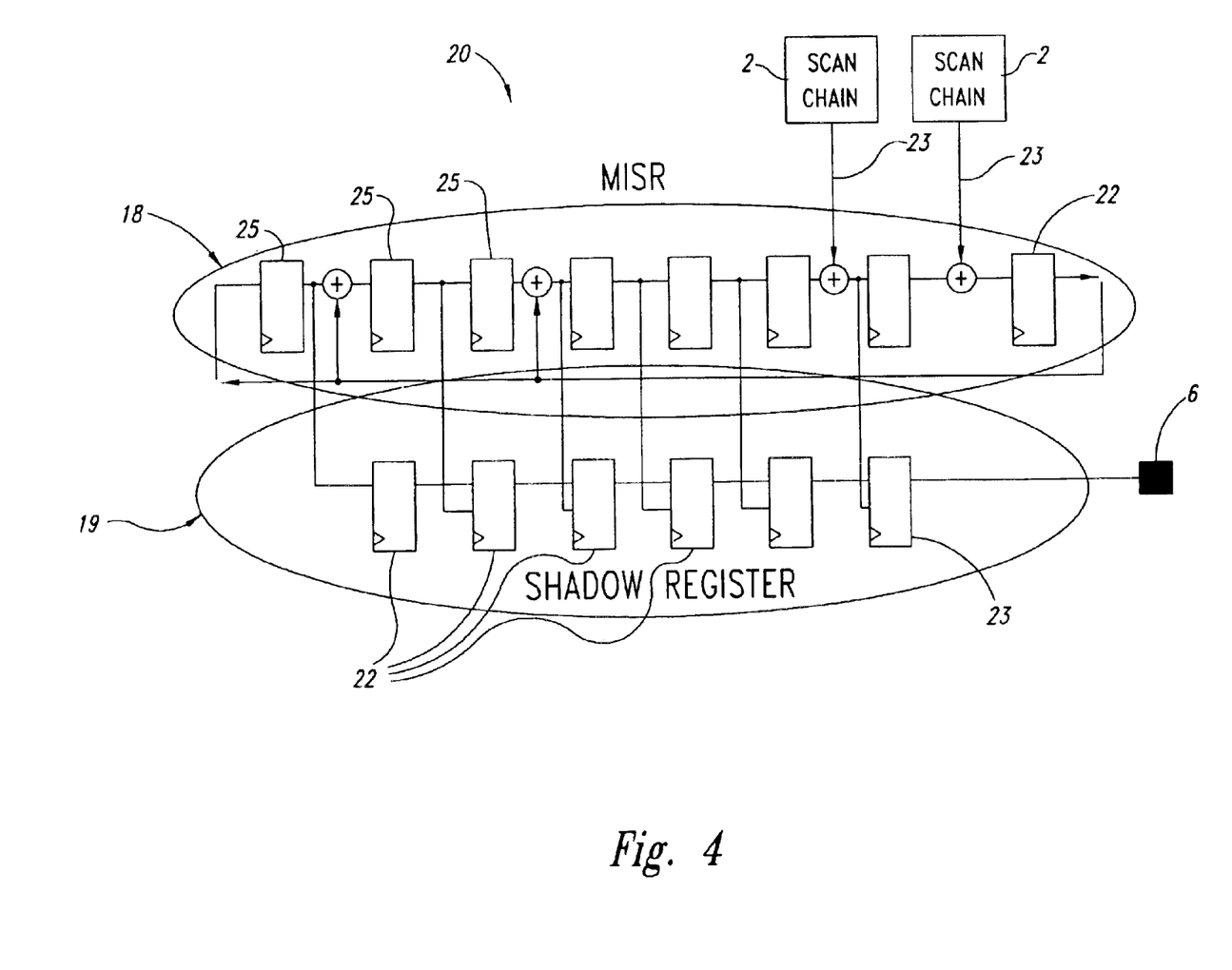
FIG. 4 shows the MISR arrangement of FIG. 3 in greater detail.

The multiple input shift register (MISR) 18 comprises a series of flip-flops 22 which receive at inputs 23 the outputs from the scan chains 2. Then data shifted to the next flip-flop is presented at the output of the last flip-flop, which is presented at the output of the first; thereby creating a circulating register. The circuit also includes some non-scan flip-flops 25. The MISR continues to receive the test pattern sequence from the scan chains 2 at inputs 23 until the scan chains are emptied, at which point the MISR 18 copies its contents to the shadow register to read out the resultant sequence at output pin 6. The output sequence at pin 6 is therefore a combination of the output sequences from the scan chains 2 and is a reduced bit sequence in comparison to the total of the test patterns in the scan chains. In this sense, the bit sequences are compressed. In essence, the MISR accumulates the scan chain outputs over the number of clock cycles required to unload each scan chain. One disadvantage of this is that an undefined value, an "X", will propagate throughout the MISR until the whole scan chain is unloaded.

Figure 5:
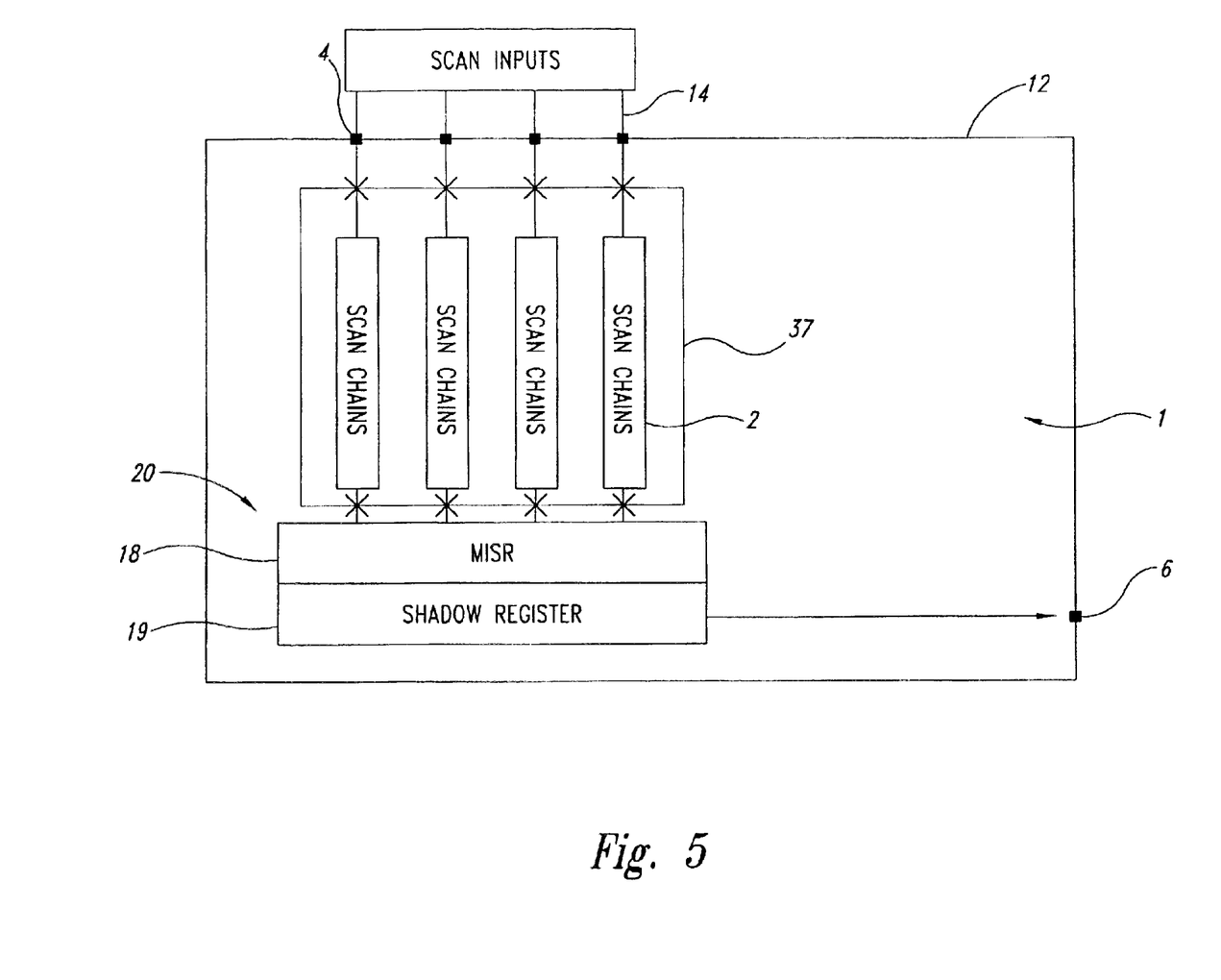
FIG. 5 shows the view of the scan chain arrangement by an Automatic Test Pattern Generator (ATPG)

The known analysis tools are configured to work with discrete scan chains, however, they are not configured to work with a compressed output sequence as described above. This is shown diagrammatically in FIG. 5 by view which shows the portion 37 of the chip 1 which ATPG tools analyze.

Figure 6:
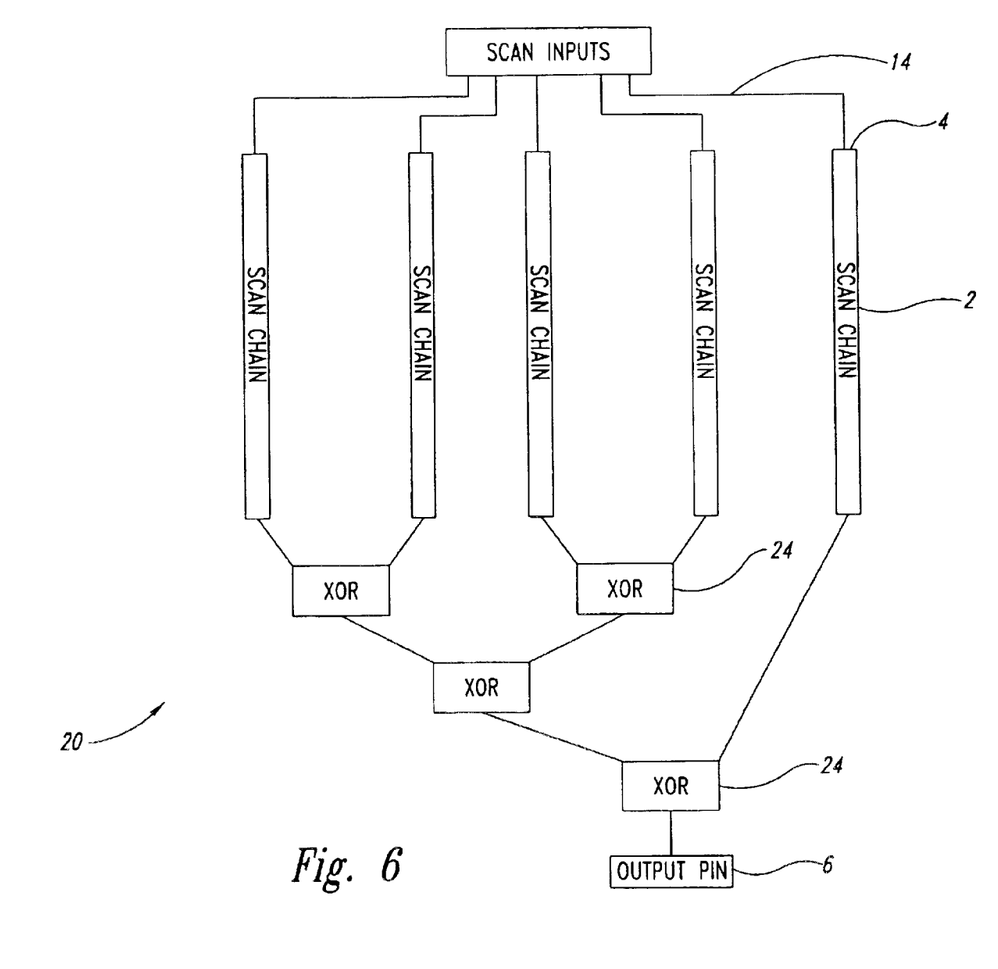
FIG. 6 shows an alternative improved scan chain using an XOR tree as an output.

A further improved arrangement is shown in FIG. 6. This comprises the scan inputs 14 via pins 4 and scan chains 2 as previously described. The compression logic 20 here comprises 9 a plurality of XOR gates 24 configured as an XOR tree, so that the plurality of outputs signals are combined (and thereby compressed) to a single output bit signal. Each XOR gate 24 produces a logic 1 when its inputs are different so that the output at pin 6 is a logical combination of all outputs of the scan chains 2 at any instant. Thus, as with the MISR solution, a signal output pin 6 is required and the output signal is considerably compressed in comparison to the input signals.

In the MISR arrangement, there are advantages in that only a single output pin is required, all other pins being used as scan inputs. This effectively allows twice the number of scan chains to be used with half the length thereby improving test coverage. Similarly, the XOR tree arrangement halves the number of flip-flops required per scan chain and involves less logic than the MISR. The output is a logic combination of the scan outputs and can use a single XOR tree, or could distribute XOR trees outside each block of circuitry, or within each block, or as a single tree. An advantage of the XOR tree arrangement is that an undefined value, an "X" at any point in the XOR tree is corrected on the next clock cycle and so does not propagate throughout the compression logic as in the MISR example.

The distributed arrangement of XOR trees for use with scan chains would be as shown in FIG. 6, with an XOR tree arranged on each block of a circuit, and having a single output pin for each XOR tree on each block. The output pins in turn connect as an XOR tree. This is a flexible arrangement because blocks of chips can be designed and implemented in isolation, and subsequently connected. This is in contrast to a single XOR tree which would require multiple pins on each block to connect to the separate XOR tree.

As previously noted, however, the compression logic 20 does remove the information as to which scan chain (or claims) produce an error signal. This is alleviated by the arrangement shown in FIG. 7.

Figure 7:
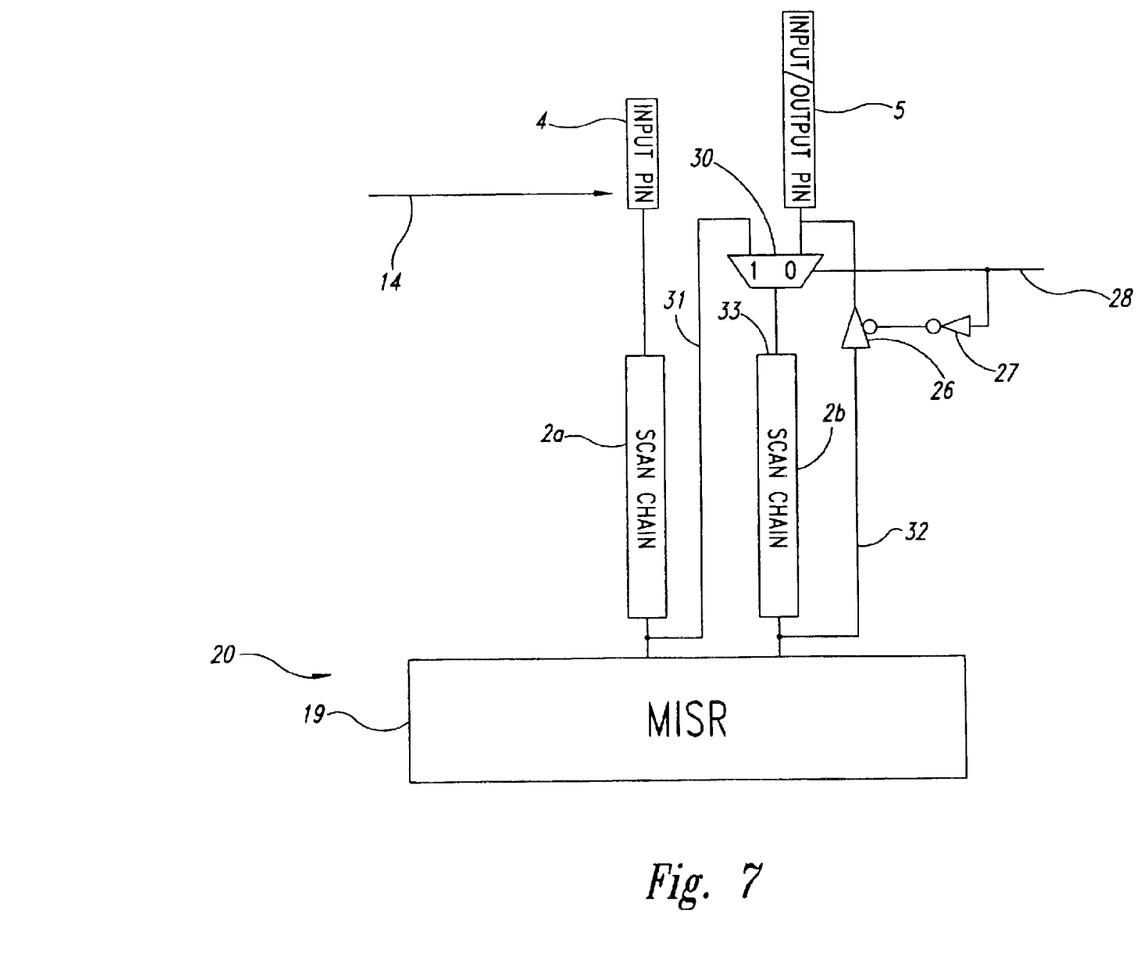
FIG. 7 shows a further improved scan chain arrangement for use with the arrangements of FIG. 3 or FIG. 6.

The scan arrangement again comprises scan chains 2 which receive test patterns signals 14. Via an input pin 4 each scan chain provides an output to compression logic 20, here shown as MISR 19, but however this could equally preferably be an XOR tree as previously described, or but could be other logic. For simplicity, a single pair of scan chains will be described, although, in practice, there will be hundreds.

The scan chains 2 are arranged in pairs so that an output line 31 from a first scan chain 2a of the pair is provided to an input 33 of the second 2b via a multiplexer 30. The multiplexer allows operation in two modes. In a test mode, test control signal on line 28 is logic "0" setting the pin 5 to be an input to the second scan chain 2b via input 33. Simultaneously, inverter 27 receives the test control signal and controls gate 26 so that line 32 is not fed back to pin 5. In this mode, the pin 5 is an input pin (as is pin 4) and the two scan chains 2a, 2b operate with the compression circuitry exactly as described in relation to FIGS. 2 to 6.

In a debug mode, the test control signal on line 28 is logic "1" setting the multiplexer 30 so that line 31 connects the output of scan chain 2a to the input 33 of scan chain 2b. Simultaneously, inverter 27 and gate 28 are set so that the output of the second scan chain 2b is provided over line 32 to pin 5 which is now an output. In this mode, the scan chains operate as shown in and described in relation to FIG. 1.

The chip can now be tested with effectively twice the number of scan chains, but the same number of pins (all acting as inputs) or the same number of chains and half the pins acting as inputs with the other half configured as outputs.

The circuit embodying the invention thereby improves test coverage and testing speed whilst retaining the ability to individually test scan chains.

From the foregoing it will be appreciated that, although specific embodiments of the invention have been described herein for purposes of illustration, various modifications may be made without deviating from the spirit and scope of the invention. Accordingly, the invention is not limited except as by the appended claims and the equivalents thereof.

What is claimed is:

1. A semiconductor integrated circuit having a test scan arrangement, comprising:

a plurality of scan chains each having an input end and an output end and being arranged in pairs of a first scan chain and a second scan chain;

a plurality of first terminals and second terminals;

compression logic having a plurality of inputs and at least one output, the plurality of inputs being connected to the output ends of the plurality of scan chains, and the at least one output being connected to at least one compression logic output terminal of the semiconductor integrated circuit for external connection;

the plurality of first terminals each being connected to the input end of the first scan chain of one pair of scan chains for external input connection;

the plurality of second terminals each being selectively connected, in a first state, to the input end of the second scan chain of one of each pair of scan chains for external input connection or, in a second state, to the output end of the second scan chain for external output connection;

the input end of the second scan chain of each pair being selectively connectable in the second state to the output end of the first scan chain of each pair.

2. A semiconductor integrated circuit according to claim 1, further comprising a switch associated with each pair of scan chains for selectively connecting the input end of the second scan chain of each pair to the output end of the first scan chain of each pair, or the input end of the second scan chain of each pair to one of the plurality of second terminals.

3. A semiconductor integrated circuit according to claim 1, further comprising a plurality of multiplexers, each of the plurality of multiplexers being associated with one of the pairs of scan chains, and having a first multiplexer input connected to the output end of the first scan chain of a pair, a second multiplexer input connected to one of the second terminals for external input connection, and a multiplexer output connected to the input of the second scan chain of each pair.

4. A semiconductor integrated circuit according to claim 1, further comprising a plurality of gates, each gate being connected between the output end of the second scan chain of one of each pair of scan chains and one of the plurality of second terminals to selectively connect, in the second state, the output end of each second scan chain to one of the plurality of second terminals.

5. A semiconductor integrated circuit according to claim 1, further comprising a switching arrangement arranged to selectively connect the output end of the first scan chain of each pair to the input end of the second scan chain of each pair, the input end of the second scan chain of each pair one of the second terminals, and the output end of the second scan chain of each pair to one of the second terminals.

6. A semiconductor integrated circuit according to claim 1, wherein the compression logic is arranged to receive signals from the output ends of the plurality of scan chains and to produce at least one compressed output at the compression logic output terminal.

7. A semiconductor integrated circuit according to claim 6, wherein the compression logic comprises a multiple input shift register.

8. A semiconductor integrated circuit according to claim 6, wherein the compression logic comprises an XOR tree.

9. A semiconductor integrated circuit according to claim 6, wherein the semiconductor integrated circuit comprises a plurality of blocks, and the compression logic comprises an XOR tree arranged on each block each having an XOR tree output, and a further XOR tree arranged to receive the XOR tree outputs.

10. A semiconductor integrated circuit having a test scan arrangement, the arrangement comprising:

a plurality of connected blocks;

plurality of scan chains on each block each having an input end and an output end;

a plurality of first terminals and second terminals;

the plurality of first terminals each being connected to the input end of one of the scan chains for external input connection;

the plurality of second terminals each being selectively connected, in a first state, to the input end of one of the scan chains for external input connection or, in a second state, to the output end of one of the scan chains for external output connection;

compression logic having a plurality of inputs and at least one output, the plurality of inputs being connected to the output ends of the plurality of scan chains, the at least one output being connected to at least one compression logic output terminal of the semiconductor integrated circuit for external connection;

the compression logic comprising a distributed XOR tree arrangement comprising an XOR tree located on each block and having a block XOR tree output, and a further XOR tree connected to each block XOR tree output and connected to at least one compression logic output terminal of the semiconductor integrated circuit for external connection.

11. A semiconductor integrated circuit having a test scan arrangement, comprising:

a plurality of scan chains each having an input end and an output end and being arranged in pairs of a first scan chain and a second scan chain;

a plurality of external input pins and external bi-directional pins;

compression logic having a plurality of inputs and at least one output, the plurality of inputs being connected to the output ends of the plurality of scan chains, and the at least one output being connected to at least one compression logic external output pin of the semiconductor integrated circuit for external connection;

the plurality of external input pins each being connected to the input end of the first scan chain of one pair of scan chains;

the plurality of external bi-directional pins each being selectively connected, in a first state, to the input end of the second scan chain of one of each pair of scan chains for external input connection or, in a second state, to the output end of the second scan chain for external output connection;

the input end of the second scan chain of each pair being selectively connectable in the second state to the output end of the first scan chain of each pair.

12. A semiconductor integrated circuit according to claim 11, further comprising a multiplexer configured to selectively connect the output end of the first scan chain of each pair or the external bi-directional pin for each pair to the input end of the second scan chain of each pair.

13. A semiconductor integrated circuit according to claim 11, further comprising a buffer for driving the output of the second scan chain of each pair to the external bi-directional pin.

14. A semiconductor integrated circuit according to claim 13, wherein the buffer includes an enable input for enabling the buffer during the second state.

15. A semiconductor integrated circuit according to claim 14, further comprising a multiplexer configured to selectively connect the output end of the first scan chain of each pair or the external bi-directional pin for each pair to the input end of the second scan chain of each pair.

16. A semiconductor integrated circuit according to claim 15, wherein the multiplexer and the buffer are controlled by a common control signal.

* * * * *